(12) United States Patent
Kim

(10) Patent No.: US 12,150,332 B2
(45) Date of Patent: Nov. 19, 2024

(54) ELECTROLUMINESCENCE DISPLAY DEVICE HAVING A THROUGH-HOLE IN DISPLAY AREA

(71) Applicant: LG Display Co., Ltd., Seoul (KR)

(72) Inventor: Junggi Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/889,182

(22) Filed: Aug. 16, 2022

(65) Prior Publication Data

US 2022/0399522 A1 Dec. 15, 2022

Related U.S. Application Data

(63) Continuation of application No. 16/670,467, filed on Oct. 31, 2019, now Pat. No. 11,456,437.

(30) Foreign Application Priority Data

Nov. 1, 2018 (KR) .................. 10-2018-0132691

(51) Int. Cl.
*H10K 59/12* (2023.01)
*H10K 50/842* (2023.01)
*H10K 50/844* (2023.01)
*H10K 59/65* (2023.01)

(52) U.S. Cl.
CPC ....... *H10K 50/8426* (2023.02); *H10K 50/844* (2023.02); *H10K 59/12* (2023.02); *H10K 59/65* (2023.02)

(58) Field of Classification Search
CPC .. H10K 50/8426; H10K 59/65; H10K 50/844; H10K 59/12

USPC ........................................................... 257/40
See application file for complete search history.

(56) References Cited

U.S. PATENT DOCUMENTS

| 9,632,487 | B2 | 4/2017 | Kim et al. |
| 10,396,310 | B2 | 8/2019 | Choi et al. |
| 10,615,369 | B2 * | 4/2020 | Choi ............ H10K 59/123 |

(Continued)

FOREIGN PATENT DOCUMENTS

| CN | 107275363 A | 10/2017 |
| CN | 107359263 A | 11/2017 |

(Continued)

*Primary Examiner* — Ori Nadav
(74) *Attorney, Agent, or Firm* — Birch, Stewart, Kolasch & Birch, LLP

(57) ABSTRACT

An electroluminescence display device can include a substrate having a display area and a non-display area adjacent with the display area, where the display area includes a plurality of pixels for displaying images. The display device can further include a thin film transistor on the substrate, a light emitting diode electrically connected with the thin film transistor and including a pixel driving electrode, a light emitting layer and a common electrode. The display device can further include an encapsulation layer disposed on the light emitting diode, where the encapsulation layer can include a first inorganic layer, a second inorganic layer on the first inorganic layer, and an organic layer between the first inorganic layer and the second inorganic layer. The display device can further include a through-hole disposed in the display area and penetrating the substrate and the encapsulation layer.

26 Claims, 5 Drawing Sheets

(56) References Cited

U.S. PATENT DOCUMENTS

| | | | |
|---|---|---|---|
| 2010/0328256 A1* | 12/2010 | Harada | G06F 3/0445 |
| | | | 345/174 |
| 2012/0013970 A1 | 1/2012 | Shin et al. | |
| 2016/0077366 A1 | 3/2016 | Kim et al. | |
| 2017/0031323 A1 | 2/2017 | Kim et al. | |
| 2017/0148856 A1* | 5/2017 | Choi | H10K 59/124 |
| 2018/0122882 A1 | 5/2018 | Lee et al. | |

FOREIGN PATENT DOCUMENTS

| | | |
|---|---|---|
| CN | 108649141 A | 10/2018 |
| KR | 10-2017-0015632 A | 2/2017 |
| KR | 10-2017-0059864 A | 5/2017 |
| KR | 10-2017-0115177 A | 10/2017 |
| KR | 10-2018-0062155 A | 6/2018 |

* cited by examiner

ELECTROLUMINESCENCE DISPLAY DEVICE HAVING A THROUGH-HOLE IN DISPLAY AREA

CROSS-REFERENCE TO RELATED APPLICATIONS

This application is a Continuation of U.S. patent application Ser. No. 16/670,467 filed on Oct. 31, 2019, which claims the priority benefit of the Korean Patent Application No. 10-2018-0132691 filed on Nov. 1, 2018, the entire contents of all these applications being hereby expressly incorporated by reference into the present application.

BACKGROUND

Field of the Invention

The present disclosure relates to an electroluminescence display device having a through-hole in a display area, and more particularly, to an electroluminescence display device provided with a device, such as a camera hole, for receiving light by passing through a substrate or a through-hole, into which an additional device passing through a substrate can be inserted, arranged in a display area.

Discussion of the Related Art

Among display devices, an electroluminescence display device is a self-light emitting device, and has advantages in that a viewing angle and a contrast ratio are more excellent than those of other display devices. Further, since the electroluminescence display device does not require a separate backlight, it is advantageous that the electroluminescence display device is able to be thin and lightweight and has low power consumption. Furthermore, an organic light emitting display device of the electroluminescence display device has advantages in that it can be driven at a low direct current voltage, has a fast response speed, and has a low manufacturing cost.

The electroluminescence display device includes a plurality of electroluminescence diodes. The electroluminescence diode includes an anode electrode, a light emitting layer formed on the anode electrode, and a cathode electrode formed on the light emitting layer. If a high potential voltage is applied to the anode electrode and a low potential voltage is applied to the cathode electrode, holes in the anode electrode and electrons in the cathode electrode respectively move to the light emitting layer. When holes and electrons are combined with each other in the light emitting layer, exciton is formed during an excitation process, and light is generated due to the energy from the exciton. The electroluminescence display device displays an image by electrically controlling the amount of light generated from the light emitting layers of the plurality of electroluminescence diodes partitioned by banks.

The electroluminescence display device is applied as various products in various fields due to its ultra-thin profile and excellent flexibility. However, the electroluminescence display device has a drawback in that it is vulnerable to water and oxygen. For this reason, in order that the electroluminescence display device is applied to various fields and developed as various types of display devices, a method for shielding water and oxygen from permeating into the electroluminescence display device is desired. Particularly, if a through-hole is located inside a display area, development of a structure that can shield water and oxygen from permeating into the periphery of the through-hole is desired.

SUMMARY OF THE DISCLOSURE

An object of the present disclosure is to provide an electroluminescence display device that maximizes an area of a display area, in which an additional device, such as a camera hole, for receiving light by passing through a substrate is arranged, or a through-hole for providing components by passing through a substrate is arranged in the display area for displaying an image. Optionally, another object of the present disclosure is to provide an electroluminescence display device having a structure that can shield water permeation to a light emitting diode of a display element arranged near a through-hole even though the through-hole is provided in a display area. Another object of the present disclosure is to provide an electroluminescence display device which address the limitations and disadvantages associated with the related art devices.

To achieve one of the above objects, an electroluminescence display device according to one embodiment of the present disclosure comprises a substrate, a through-hole, an inner dam, and a hole-trench. The substrate includes a display area where a plurality of pixels for displaying images are arranged, and a non-display area surrounding the display area. The through-hole is arranged inside the display area. The inner dam surrounds the through-hole. The hole-trench surrounds the inner dam, and is formed as the substrate is partially recessed as much as a certain thickness.

For example, the display area includes a light emitting diode for expressing image information, and a driving element for driving the light emitting diode. The through-hole is formed by removing the substrate, the light emitting diode and the driving element.

For example, the hole-trench includes a bottom surface, an upper surface, and a sidewall. The bottom surface is defined at a position more recessed at a certain depth than an upper surface of the substrate. The upper surface is defined on the upper surface of the substrate. The sidewall connects the bottom surface with the upper surface. A light emitting layer of the light emitting diode is deposited on the bottom surface and the upper surface except the sidewall.

For example, the hole-trench has a well shape recessed by removing the substrate as much as 20% to 70% in a thickness direction.

For example, the hole-trench is arranged between the inner dam and adjacent pixels arranged to be close to the inner dam among the pixels.

For example, the hole-trench has a closed curve shape corresponding to a shape of the through-hole.

For example, the hole-trench has any one of a polygonal shape, a circular shape and an oval shape, which surround the through-hole.

For example, the hole-trench has a width narrower than that of the inner dam.

For example, the inner dam includes a first inner dam adjacent to the through-hole, and a second inner dam surrounding the first inner dam.

For example, the hole-trench is arranged between the first inner dam and the second inner dam.

For example, the electroluminescence display device further comprises a thin film transistor layer, a planarization layer, an anode electrode, and a bank. The thin film transistor layer is formed on the substrate. The planarization layer covers the thin film transistor layer. The anode electrode is connected with a thin film transistor arranged in the thin film transistor layer and arranged on the planarization layer. The bank defines a light emitting area in the anode electrode. The hole-trench passes through the bank, the planarization layer and the thin film transistor layer, and is formed by removing the substrate as much as a certain thickness.

For example, the inner dam further includes a spacer deposited on the planarization layer and the bank, surrounding the through-hole.

For example, the electroluminescence display device further comprises an outer dam, a light emitting layer, a cathode electrode, a first inorganic encapsulation layer, an organic encapsulation layer, and a second inorganic encapsulation layer. The outer dam is arranged in the non-display area, and surrounds the display area. The light emitting layer covers the pixels, the inner dam and the hole-trench on the substrate between the outer dam and the through-hole. The cathode electrode is deposited on the light emitting layer. The encapsulation layer covers the cathode electrode.

For example, the through-hole is not provided with the substrate, the thin film transistor layer, the planarization layer, the light emitting layer, the cathode electrode and the encapsulation layer. The light emitting layer is exposed from a sidewall of the through-hole.

For example, the encapsulation layer includes a first inorganic encapsulation layer, an organic encapsulation layer deposited on the first inorganic encapsulation layer, and a second inorganic encapsulation layer deposited on an upper surface of the organic encapsulation layer.

In the electroluminescence display device according to one embodiment of the present disclosure, since the through-hole is provided in the display area, an area ratio occupied by the non-display area is minimized, and an area ratio of the display area is maximized. In the electroluminescence display device according to one embodiment of the present disclosure, since the inner dam the hole-trench are provided near the through-hole, water is prevented from being externally permeated into the light emitting diode. In the electroluminescence display device according to one embodiment of the present disclosure, even though a hole passing through the display panel is provided in the display area, external water and particles are shielded from permeating and being diffused into the display element, whereby it is possible to make sure of stability and lifetime of the product.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
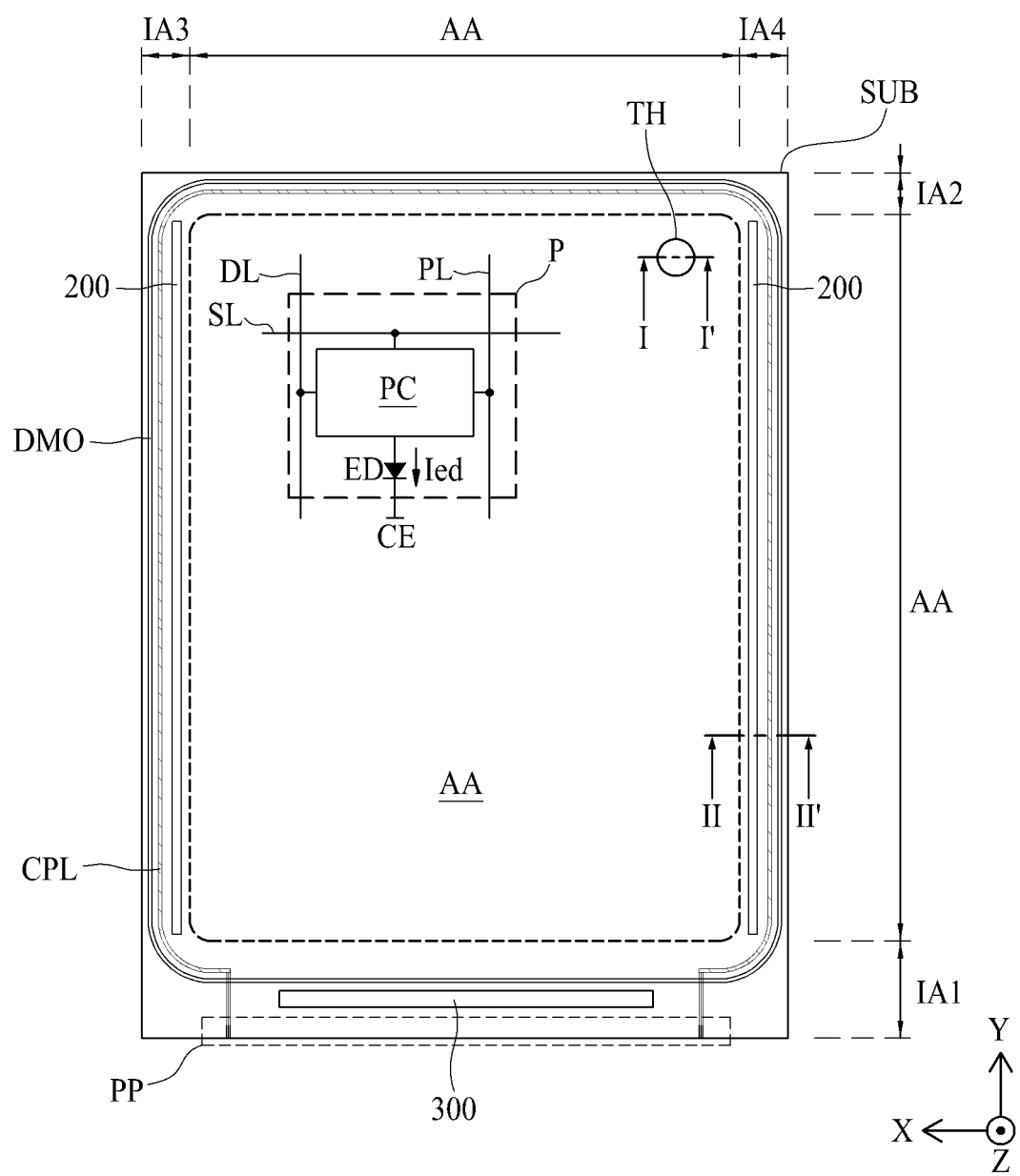
FIG. 1 is a plane view illustrating an electroluminescence display device comprising a through-hole in a display area according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present disclosure are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-' and 'next to-', one or more portions can be arranged between two other portions unless 'just' or 'direct' is used.

In describing a time relationship, for example, when the temporal order is described as 'after-', 'subsequent-', 'next-', and 'before-' a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, an example of an electroluminescence display device according to the present disclosure will be described in detail with reference to the accompanying drawings. Wherever possible, the same reference numbers will be used throughout the drawings to refer to the same or like parts.

Hereinafter, an electroluminescence display device according to the embodiments of the present disclosure will be described in detail with reference to the accompanying drawings. All the components of the electroluminescence display device according to all embodiments of the present disclosure are operatively coupled and configured.

Particularly, FIG. 1 is a plane view illustrating an electroluminescence display device comprising a through-hole in a display area according to the present disclosure. Referring to FIG. 1, the electroluminescence display device according to the present disclosure includes a substrate SUB, a pixel P, a common power line CPL, an outer dam DMO, a driving portion comprising a pad portion PP, a gate driving circuit 200 and a driving integrated circuit 300, and a through-hole TH.

The substrate SUB is a base substrate (or base layer), and includes a plastic material or a glass material. In view of characteristics of a display device, it is preferable that the substrate SUB is transparent. However, as the case can be, for example, in case of a top emission type display device, an opaque material can be used as the substrate SUB.

The substrate SUB according to one example can have a rectangular shape, a rounded rectangular shape, each of whose corner portions is rounded with a certain curvature radius, or a non-rectangular shape having at least six sides, on a plane. In this case, the substrate SUB having a non-rectangular shape can include at least one protrusion or at least one notch portion.

The substrate SUB according to one example can be categorized into a display area AA and a non-display area IA. The display area AA is provided at most of center portions of the substrate SUB, and can be defined as an area for displaying an image. The display area AA according to one example can have a rectangular shape, a rounded rectangular shape, each of whose corner portions is rounded with a certain curvature radius, or a non-rectangular shape having at least six sides, on a plane. In this case, the display area AA having a non-rectangular shape can include at least one protrusion or at least one notch portion.

The non-display area IA is provided on an edge area of the substrate SUB to surround the display area AA, and can be defined as an area where an image is not displayed, or a peripheral area. The non-display area IA according to one example can include a first non-display area IA1 provided on a first edge of the substrate SUB, a second non-display area IA2 provided on a second edge of the substrate SUB in parallel with the first non-display area IA1, a third non-display area IA3 provided on a third edge of the substrate SUB, and a fourth non-display area IA4 provided on a fourth edge of the substrate SUB in parallel with the third non-display area IA3. For example, the first non-display area IA1 can be, but is not limited to, an upper (or lower) edge area of the substrate SUB, the second non-display area IA2 can be, but is not limited to, a lower (or upper) edge area of the substrate SUB, the third non-display area IA3 can be, but is not limited to, a left (or right) edge area of the substrate SUB, and the fourth non-display area IA4 can be, but is not limited to, a right (or left) edge area of the substrate SUB.

A plurality of pixels P can be provided on the display area AA of the substrate SUB. The pixels P according to one example can be a plurality of pixels arranged in a matrix arrangement, and can be arranged in the display area AA of the substrate SUB. The pixels P can be defined by scan lines SL, data lines DL, and pixel driving power lines PL.

The scan line SL is longitudinally extended along a first direction X and arranged along a second direction Y crossing the first direction X at a certain interval. The display area AA of the substrate SUB includes a plurality of scan lines SL spaced apart from one another along the second direction Y in parallel with the first direction X. In this case, the first direction X can be defined as a horizontal direction of the substrate SUB and the second direction Y can be defined as a vertical direction of the substrate SUB, or vice versa without limitation to this case.

The data line DL is longitudinally extended along the second direction Y and arranged along the first direction X at a certain interval. The display area AA of the substrate SUB includes a plurality of data lines DL spaced apart from one another along the first direction X in parallel with the second direction Y.

The pixel driving power line PL can be arranged on the substrate SUB to be parallel with the data line DL. The display area AA of the substrate SUB includes a plurality of pixel driving power lines PL parallel with the data lines DL. Optionally, the pixel driving power lines PL can be arranged to be parallel with the scan lines SL.

The pixels P according to one example can be arranged on the display area AA to have a stripe structure. In this case, one unit pixel can include a red subpixel, a green subpixel, and a blue subpixel. Moreover, one unit pixel can further include a white subpixel.

The pixels P according to another example can be arranged on the display area AA to have a pentile structure. In this case, one unit pixel can include at least one red subpixel, at least two green subpixels, and at least one blue pixel, which are arranged in a polygonal shape two-dimensionally. For example, one unit pixel having a pentile structure can be arranged such that one red subpixel, two green subpixels and one blue subpixel have an octagonal shape two-dimensionally. In this case, the blue subpixel can have an opening area (or light emitting area) which is relatively the greatest, and the green subpixel can have an opening area which is relatively the smallest.

The pixel P can include a pixel circuit PC electrically connected with its adjacent scan line SL, data line DL and pixel driving power line PL, and a light emitting diode ED electrically connected with the pixel circuit PC.

The pixel circuit PC controls a current Ted flowing from the pixel driving power line PL to the light emitting diode ED based on a data voltage supplied from its adjacent data line DL in response to a scan signal supplied from at least one scan line SL adjacent thereto.

The pixel circuit PC according to one example can include at least two thin film transistors and one capacitor. For example, the pixel circuit PC according to one example can include a driving thin film transistor supplying the data current Ted based on the data voltage to the light emitting diode ED, a switching thin film transistor supplying the data voltage supplied from the data line DL to the driving thin film transistor, and a capacitor storing a gate-source voltage of the driving thin film transistor.

The pixel circuit PC according to another example can include at least three thin film transistors and at least one capacitor. For example, the pixel circuit PC according to another example can include a current supply circuit, a data supply circuit and a compensation circuit in accordance with an operation (or function) of each of at least three thin film transistors. In this case, the current supply circuit can include a driving thin film transistor supplying the data current Ted based on the data voltage to the light emitting diode ED. The data supply circuit can include at least one switching thin film transistor supplying the data voltage supplied from the data line DL to the current supply circuit in response to at least one scan signal. The compensation circuit can include at least one compensation thin film transistor compensating for a change of a characteristic value (threshold voltage and/or mobility) of the driving thin film transistor in response to at least one scan signal.

The light emitting diode ED emits the light of luminance corresponding to the data current Ted supplied from the pixel circuit PC. In this case, the data current Ted can flow from the pixel driving power line PL to the common power line CPL through the driving thin film transistor and the light emitting diode ED.

The light emitting diode ED according to one example can include a pixel driving electrode AE (or first electrode or anode) electrically connected with the pixel circuit PC, a light emitting layer EL formed on the pixel driving electrode, and a common electrode CE (or second electrode or cathode) electrically connected with the light emitting layer.

The common power line CPL is arranged on the non-display area IA of the substrate SUB and electrically connected with the common electrode CE arranged on the display area AA. The common power line CPL according to one example is arranged along the second to fourth non-display areas IA2, IA3 and IA4 adjacent to the display area AA of the substrate SUB while having a certain line width, and surrounds the other portion except a portion of the display area AA adjacent to the first non-display area IA1 of the substrate SUB. One end of the common power line CPL can be arranged on one side of the first non-display area IA1, and the other end of the common power line CPL can be arranged on the other side of the first non-display area IA1. One end and the other end of the common power line CPL can be arranged to surround the second to fourth non-display areas IA2, IA3 and IA4. Therefore, the common power line CPL according to one example can two-dimensionally have a '⋂' shape of which one side corresponding to the first non-display area IA1 of the substrate SUB is opened.

An encapsulation layer can be formed on the substrate SUB to surround an upper surface and a side of the display area AA and the common power line CPL. Meanwhile, the encapsulation layer can expose one end and the other end of the common power line CPL in the first non-display area IA1. The encapsulation layer can prevent oxygen or water from permeating into the light emitting diode ED provided in the display area AA. The encapsulation layer according to one example can include at least one inorganic film. The encapsulation layer according to another example can include a plurality of inorganic films and organic films interposed among the plurality of inorganic films.

The driving portion according to one embodiment of the present disclosure can include a pad portion PP, a gate driving circuit 200, and a driving integrated circuit 300.

The pad portion PP can include a plurality of pads provided in the non-display area IA of the substrate SUB. The pad portion according to one example can include a plurality of common power supply pads, a plurality of data input pads, a plurality of power supply pads and a plurality of control signal input pads, which are provided in the first non-display area IA1 of the substrate SUB.

The gate driving circuit 200 is provided in the third non-display area IA3 and/or the fourth non-display area IA4 of the substrate SUB and connected with the scan lines SL provided in the display area AA in a one-to-one relationship. The gate driving circuit 200 can be integrated with the third non-display area IA3 and/or the fourth non-display area IA4 of the substrate SUB together with a manufacturing process of the pixel P, that is, a manufacturing process of the thin film transistor. The gate driving circuit 200 generates a scan signal based on a gate control signal supplied from the driving integrated circuit 300 and output the scan signal in accordance with a given order, thereby driving each of the plurality of scan lines SL in accordance with a given order. The gate driving circuit 200 according to one example can include a shift register.

The outer dam DMO can have a closed curve structure in which it is provided in the first non-display area IA1, the second non-display area IA2, the third non-display area IA3 and the fourth non-display area IA4 of the substrate SUB to surround the periphery of the display area AA. For example, the outer dam DMO can be arranged outside the common power line CPL and therefore located at the outermost above the substrate SUB. Preferably, the pad portion PP and the driving integrated circuit 300 are arranged in an outer area of the outer dam DMO.

Although FIG. 1 shows that the outer dam DMO is arranged at the outermost, the outer dam DMO is not limited to the example of FIG. 1. As another example, the outer dam DMO can be arranged between the power common line CPL and the gate driving circuit 200. As other example, the outer dam DMO can be arranged between the display area AA and the gate driving circuit 200.

The driving integrated circuit 300 is packaged in a chip packaging area defined in the first non-display area IA1 of the substrate SUB through a chip packaging (bonding) process. Input terminals of the driving integrated circuit 300 are electrically connected with the pad portion PP and therefore electrically connected with the plurality of data lines DL and the plurality of pixel driving power lines PL, which are provided in the display area AA. The driving integrated circuit 300 receives various power sources, timing synchronizing signals and digital image data, which are input from a display driving circuit portion (or host circuit) through the pad portion PP, controls driving of the gate driving circuit 200 by generating a gate control signal in accordance with the timing synchronizing signals and at the same time converts the digital image data to an analog type pixel data voltage to supply the converted data voltage to the corresponding data line DL.

The through-hole TH physically passes through the display device. For example, the through-hole TH can be formed to pass through only a display panel constituting the display device. In this case, a polarizer or cover glass bonded to an upper surface of the display panel can have a structure for covering the through-hole TH without being passed through by the through-hole TH. When a through-hole TH for transmitting light, such as a camera hole or a light sensor hole, can be formed, the through-hole TH can pass through only the display panel without passing through the polarizer or the cover glass. For another example, if an additional device for fully passing through the display device is to be provided, the through-hole TH for opening all of the display panel, an optical film bonded to an upper portion of the display panel, and the cover glass can be provided.

Since the display element cannot be arranged in the through-hole TH, in the conventional art, the through hole TH should be arranged in the non-display area IA. In this case, a width and a length area of the non-display area IA, which corresponds to a width and length area of the through-hole TH, can be increased for ensuring the area for preparing the through-hole TH, whereby an area ratio of the display area AA occupied in the display panel is reduced. The present disclosure is characterized in that the through-hole TH is arranged in the display area AA. The display elements are not arranged in the area corresponding to the through-hole TH within the display area AA, but the display elements are arranged near the through-hole TH, whereby the area ratio of the display area AA occupied in the display panel can be maximized.

Figure 2:
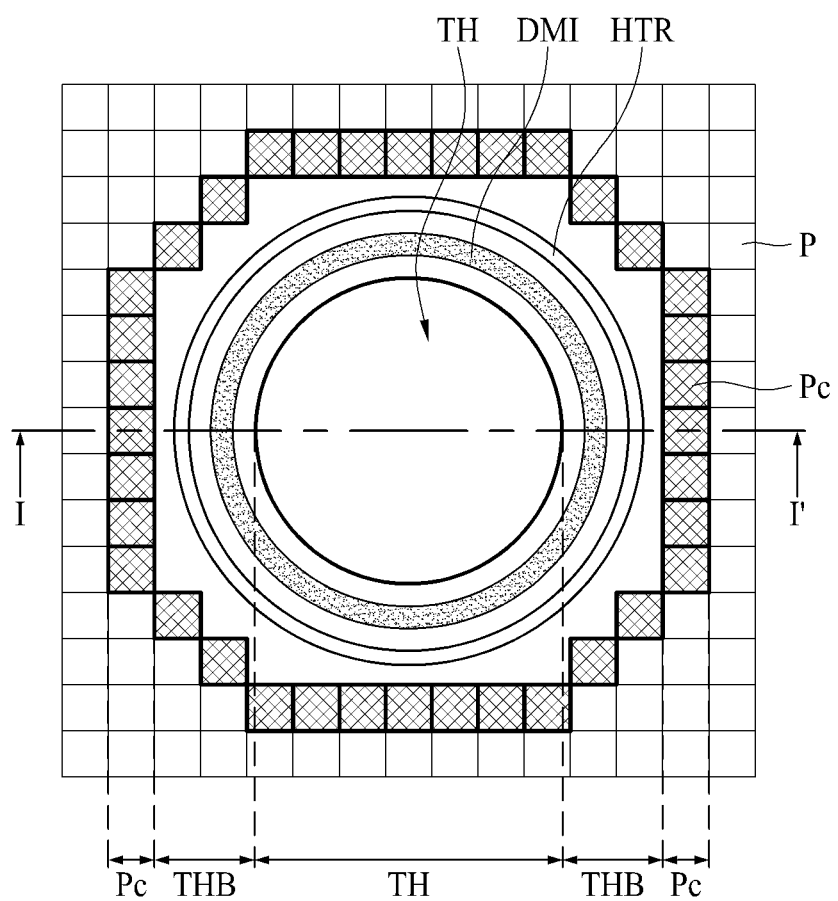
FIG. 2 is a plane enlarged view illustrating a structure of a through-hole arranged in a display area in an electroluminescence display device according to one embodiment of the present disclosure.

Hereinafter, a structural characteristic of the through-hole, which is one of main characteristics of the present disclosure, will be described in more detail with reference to FIG. 2. FIG. 2 is a plane enlarged view illustrating a structure of a through-hole arranged in a display area in an electroluminescence display device according to the present disclosure.

Referring to FIG. 2, the through-hole TH is arranged inside the display area AA. The pixels P are arranged near the through-hole TH. Among the pixels P, the pixels P arranged to be close to the through-hole TH can be defined as adjacent pixels Pc. A hole-boundary portion THB can be defined between the adjacent pixels Pc and the through-hole TH.

An inner dam DMI and a trench HTR are arranged in the hole-boundary portion THB. Particularly, the inner dam DMI is arranged to be closest to the through-hole TH. The inner dam DMI has a closed curve shape surrounding the through-hole TH while corresponding to the shape of the through-hole TH. The trench HTR is arranged between the inner dam DM1 and the adjacent pixels Pc. The trench HTR has a closed curve shape surrounding the inner dam DM1 while corresponding to the shape of the inner dam DMI. Therefore, although the inner dam DMI and the trench HTR can have their respective closed curve shapes different from each other in size, they can have the same shape as each other. For example, the inner dam DMI and the trench HTR can have a concentric circle shape and can be arranged to be spaced apart from each other at a certain interval.

Hereinafter, a sectional structure of the electroluminescence display device comprising a through-hole in a display area according to the preferred embodiment of the present disclosure will be described with reference to FIGS. 3 and 4.

Figure 3:
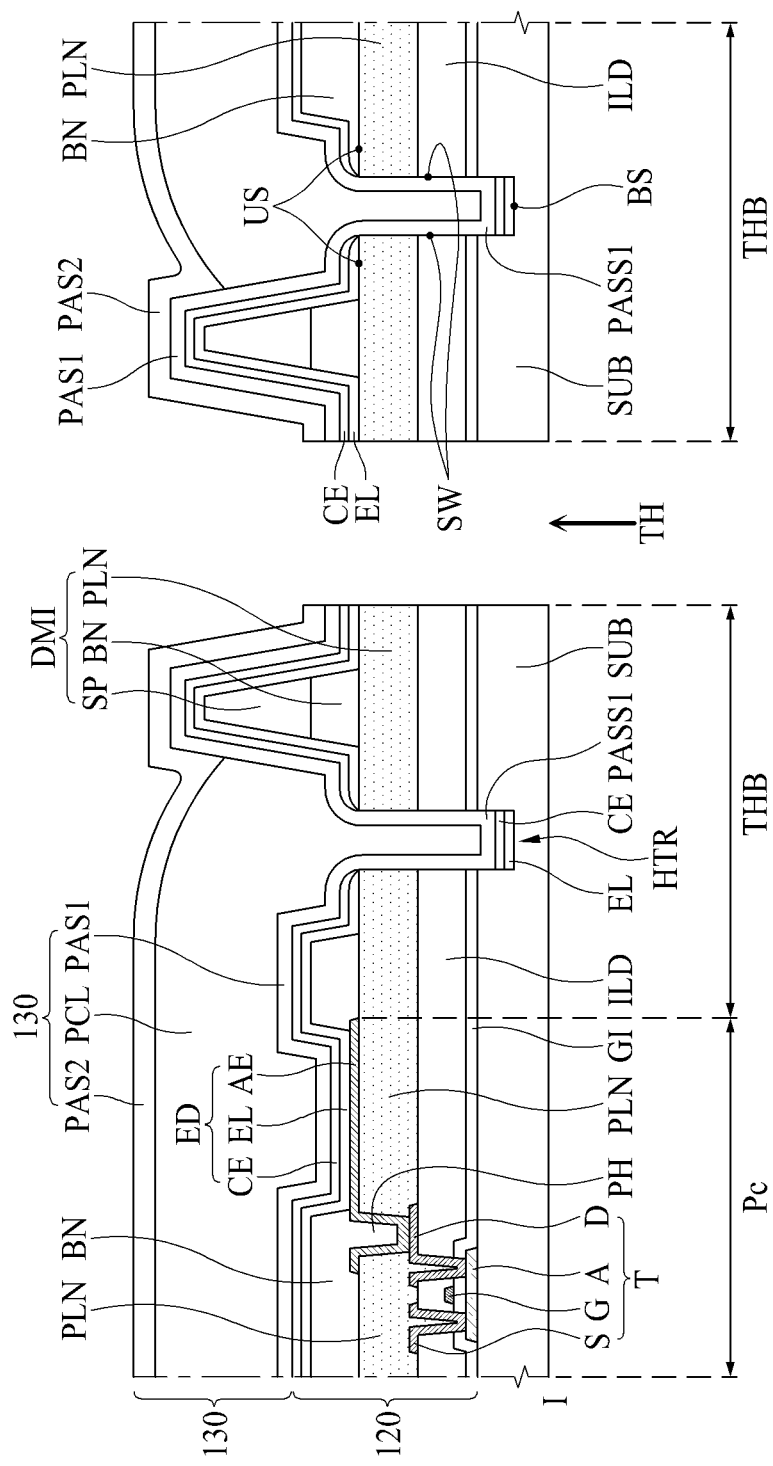
FIG. 3 is a cross-sectional view taken along line I-I' of FIG. 1, illustrating a structure of a portion where a through-hole is arranged in an electroluminescence display device according to a preferred embodiment of the present disclosure.

FIG. 3 is a cross-sectional view taken along line I-I' of FIG. 1, illustrating a structure of a portion where a through-hole is arranged in an electroluminescence display device according to the preferred embodiment of the present disclosure. FIG. 4 is a cross-sectional view taken along line II-IF of FIG. 1, illustrating a structure of one side in an electroluminescence display device according to the preferred embodiment of the present disclosure.

Figure 4:
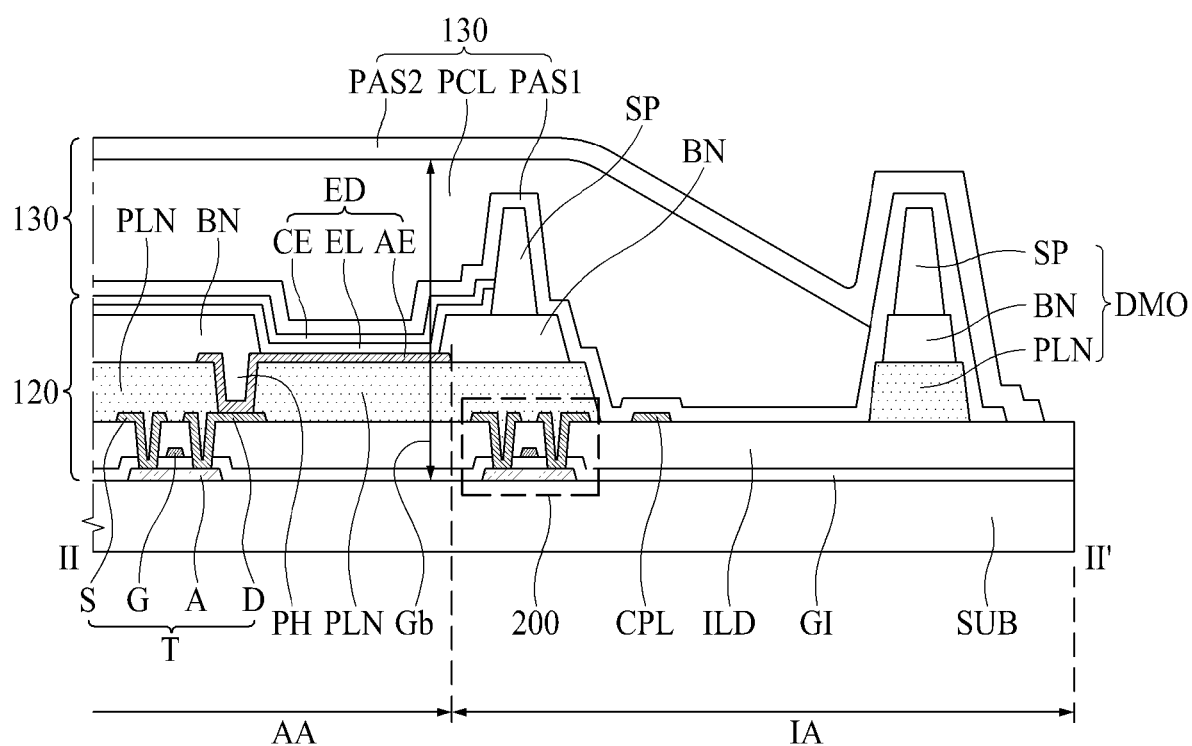
FIG. 4 is a cross-sectional view taken along line II-IF of FIG. 1, illustrating a structure of one side in an electroluminescence display device according to a preferred embodiment of the present disclosure.

Referring to FIGS. 3 and 4, the electroluminescence display device according to the preferred embodiment of the present disclosure can include a substrate SUB, a pixel array layer 120, a spacer SP, an encapsulation layer 130, and a through-hole TH.

The substrate SUB can include a display area AA and a non-display area IA surrounding the display area AA. The substrate SUB is a base layer, and includes a plastic material or a glass material. The substrate SUB according to one example can have an opaque or colored polyimide material. The substrate SUB can be a flexible substrate or a rigid substrate. For example, the flexible substrate SUB of a glass material can be a thin type glass substrate having a thickness of 100 micrometers or less or a glass substrate etched by a substrate etching process to have a thickness of 100 micrometers or less.

A buffer film can be formed on an upper surface of the substrate SUB. The buffer film is formed on one surface of the substrate SUB to shield water from permeating into the pixel array layer 120 through the substrate SUB vulnerable to water permeation. The buffer film according to one example can be made of a plurality of inorganic films deposited alternately. For example, the buffer film can be formed of a multi-layered film of one or more inorganic films of a silicon oxide film (SiOx), a silicon nitride film (SiNx) and SiON, which are deposited alternately. However, the buffer film can be omitted.

The pixel array layer 120 can include a thin film transistor layer, a planarization layer PLN, a bank pattern BN, a spacer SP, and a light emitting diode ED.

The thin film transistor layer is respectively provided in a plurality of pixels P defined in the display area AA of the substrate SUB and a gate driving circuit 200 defined in the fourth non-display area IA4 of the substrate SUB.

The thin film transistor layer according to one example includes a thin film transistor T, a gate insulating film GI, an inter-layer dielectric (ILD) film. In this case, the thin film transistor T shown in FIG. 2 can be a driving thin film transistor electrically connected with the light emitting diode ED.

The thin film transistor T includes a semiconductor A, a gate electrode G, a source electrode S and a drain electrode D, which are formed on the substrate SUB or the buffer film. FIGS. 3 and 4 show, but is not limited to, a top gate structure of the thin film transistor T, in which the gate electrode G is arranged above the semiconductor layer A. For another example, the thin film transistor T can have a bottom gate structure in which the gate electrode G is arranged below the semiconductor layer A, or a double gate structure in which the gate electrode G is arranged above and below the semiconductor layer A.

The semiconductor layer A can be formed on the substrate SUB or the buffer film. The semiconductor layer A can include a silicon based semiconductor material, an oxide based semiconductor material, or an organic based semiconductor material, and can have a single layered structure or a multi-layered structure. A light shielding layer for shielding external light entering the semiconductor layer A can additionally be formed between the buffer film and the semiconductor layer A.

The gate insulating film GI can be formed on the entire substrate SUB to cover the semiconductor layer A. The gate insulating film GI can be formed of an inorganic film, for example, a silicon oxide (SiOx) film, a silicon nitride (SiNx) film, or a multi-layered film of SiOx and SiNx.

The gate electrode G can be formed on the gate insulating film GI to overlap the semiconductor layer A. The gate electrode G can be formed together with the scan line SL. The gate electrode G according to one example can be formed of a single layer or multi-layer of any one of Mo, Al, Cr, Au, Ti, Ni, Nd, and Cu, or their alloy.

The inter-layer dielectric (ILD) film can be formed on the entire substrate SUB to cover the gate electrode G and the gate insulating film GI. The inter-layer dielectric (ILD) film provides a planarization plane on the gate electrode G and the gate insulating film GI.

The source electrode S and the drain electrode D can be formed on the inter-layer dielectric (ILD) film to overlap the semiconductor layer A. The gate electrode G is interposed between the source electrode S and the drain electrode D. The source electrode S and the drain electrode D can be formed together with the data line DL, the pixel driving power line PL and the common power line CPL. For instance, the source electrode S, the drain electrode D, the data line DL, the pixel driving power line PL and the common power line CPL are respectively formed by a patterning process for a source-drain electrode material at the same time.

Each of the source electrode S and the drain electrode D can be connected to the semiconductor layer A through an electrode contact hole that passes through the inter-layer dielectric (ILD) film and the gate insulating film GI. The source electrode S and the drain electrode D can be formed of a single layer or multi-layer of any one of Mo, Al, Cr, Au, Ti, Ni, Nd, and Cu, or their alloy. In this case, the source electrode S of the thin film transistor T shown in FIG. 2 can electrically be connected with the pixel driving power line PL.

As described above, the thin film transistor T provided in the pixel P of the substrate SUB constitutes a pixel circuit PC. Also, the gate driving circuit 200 arranged in the fourth non-display area IA4 of the substrate SUB can include a thin film transistor the same as or similar to the thin film transistor T provided in the pixel P.

The planarization layer PLN is formed on the entire substrate SUB to cover the thin film transistor layer. The planarization layer PLN provides a planarization surface on the thin film transistor layer. The planarization layer PLN according to one example can be formed of an organic film such as acrylic resin, epoxy resin, phenolic resin, polyamide resin, or polyimide resin.

The planarization layer PLN according to another example can include a pixel contact hole PH for exposing the drain electrode D of the driving thin film transistor provided in the pixel P.

The bank pattern BN is arranged on the planarization layer PLN and defines an opening area (or light emitting area) inside the pixel P of the display area AA. The bank pattern BN can be expressed as a pixel defining film.

The light emitting diode ED includes a pixel driving electrode AE, a light emitting layer EL, and a common electrode CE. The pixel driving electrode AE is formed on the planarization layer PLN and electrically connected to the drain electrode D of the driving thin film transistor through the pixel contact hole PH provided in the planarization layer PLN. In this case, the other edge portion except a center portion of the pixel driving electrode AE overlapped with the opening area of the pixel P can be covered by the bank pattern BN. The bank pattern BN can define an opening area of the pixel P by covering the edge portion of the pixel driving electrode AE.

The pixel driving electrode AE according to one example can include a metal material of high reflectivity. For example, the pixel driving electrode AE can be formed of a multi-layered structure such as a deposited structure (Ti/Al/Ti) of aluminum (Al) and titanium (Ti), a deposited structure (ITO/Al/ITO) of Al and ITO, an APC (Ag/Pd/Cu) alloy, and a deposited structure (ITO/APC/ITO) of APC alloy and ITO, or can include a single layered structure made of a material of any one or an alloy material of two or more selected from Ag, Al, Mo, Au, Mg, Ca and Ba.

The light emitting layer EL is entirely formed on the display area AA of the substrate SUB to cover the pixel driving electrode AE and the bank pattern BN. The light emitting layer EL according to one example can include two or more light emitting portions vertically deposited to emit a white light. For example, the light emitting layer EL according to one example can include first and second light emitting portions for emitting a white light by combination of a first light and a second light. In this case, the first light emitting portion emits the first light, and can include any one of a blue light emitting portion, a green light emitting portion, a red light emitting portion, a yellow light emitting portion, and a yellow-green light emitting portion. The second light emitting portion can include a light emitting portion for emitting the second light complementary to the first light, among the blue light emitting portion, the green light emitting portion, the red light emitting portion, the yellow light emitting portion, and the yellow-green light emitting portion.

The light emitting layer EL according to another example can include any one of a blue light emitting portion, a green light emitting portion and a red light emitting portion to emit a color light corresponding to a color set in the pixel P. For example, the light emitting layer EL can include any one of an organic light emitting layer, an inorganic light emitting layer and a quantum-dot light emitting layer, or can include a deposited or combination structure of the organic light emitting layer (or the inorganic light emitting layer) and the quantum-dot light emitting layer.

Additionally, the light emitting diode ED according to one example can further include a functional layer for improving light emission efficiency and/or lifetime of the light emitting layer EL.

The common electrode CE is formed to be electrically connected with the light emitting layer EL. The common electrode CE is formed on the entire display area AA of the substrate SUB and therefore commonly connected with the light emitting layers EL provided in each pixel P.

The common electrode CE according to one example can include a transparent conductive material or a semi-transmissive conductive material, which can transmit light. If the common electrode CE is formed of a semi-transmissive conductive material, light emission efficiency of light emitted from the light emitting diode ED can be enhanced through a micro cavity structure. The semi-transmissive conductive material according to one example can include Mg, Ag, or an alloy of Mg and Ag. Additionally, a capping layer for improving emission efficiency of light by controlling a refractive index of light emitted from the light emitting diode ED can further be formed on the common electrode CE.

The spacer SP can be arranged to be distributed in an opening area inside the display area AA, that is, an area where the light emitting diode ED is not arranged. The spacer SP is intended to allow a screen mask and a substrate not to be in contact with each other during a process of depositing the light emitting layer EL. The spacer SP is arranged on the bank pattern BN, and can be deposited to allow the light emitting layer EL and the common electrode CE to overstride/cover the spacer SP arranged inside the display area AA.

As the case can be, the light emitting layer EL and/or the common electrode CE may not overstride the spacer SP. Since the spacer SP is arranged in only a portion of the bank pattern BN inside the display area AA, the common electrode CE has a structure connected with the display area AA while fully covering the display area AA even though the common electrode CE does not overstride the spacer SP.

The encapsulation layer 130 is formed to surround an upper surface and a side of the pixel array layer 120. The encapsulation layer 130 serves to prevent oxygen or water from permeating into the light emitting diode ED.

The encapsulation layer 130 according to one example can include a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 serve to shield water or oxygen from permeating into the light emitting diode ED. Each of the first inorganic encapsulation layer PAS1 and the second inorganic encapsulation layer PAS2 can be formed of an inorganic material such as a silicon nitride, an aluminum nitride, a zirconium nitride, a titanium nitride, a hafnium nitride, a tantalum nitride, a silicon oxide, an aluminum oxide, or a titanium oxide. The first inorganic encapsulation layer PAS1 and the second inorganic encapsulation layer PAS2 can be formed by a Chemical Vapor Deposition (CVD) process or an Atomic Layer Deposition (ALD) process.

The organic encapsulation layer PCL is surrounded by the first inorganic encapsulation layer PAS1 and the second inorganic encapsulation layer PAS2. The organic encapsulation layer PCL can be formed to be relatively thicker than the first inorganic encapsulation layer PAS1 and/or the second inorganic encapsulation layer PAS2 to adsorb and/or shield particles that can occur during a manufacturing process. The organic encapsulation layer PCL can be made of an organic material such as SiOCx (silicon oxy-carbon) acryl or epoxy resin. The organic encapsulation layer PCL can be formed by a coating process, for example, an ink-jet coating process or a slit coating process.

The electroluminescence display device according to the first embodiment of the present disclosure can further include a dam structure. The dam structure includes an outer dam DMO arranged outside the display area AA and an inner dam DMI arranged inside the display area AA. The outer dam DMO is arranged in the non-display area IA of the substrate SUB to prevent the organic encapsulation layer PCL from overflowing. The inner dam DMI is arranged to surround the through-hole TH inside the display area AA. The outer dam DMO is only shown in FIG. 4, and the inner dam DMI is only shown in FIG. 3.

The outer dam DMO according to one example can be arranged outside the display area AA. In more detail, the outer dam DMO can be arranged outside the gate driving circuit 200, which is arranged outside the display area, and the common power line CPL arranged outside the gate driving circuit 200. As the case can be, the outer dam DMO can be arranged to overlap an outer side of the common power line CPL. In this case, a width of the non-display area IA where the gate driving circuit 200 and the common power line CPL are arranged can be reduced to reduce a bezel width.

According to the preferred embodiment of the present disclosure, the structure of dam, including the inner dam DMI and the outer dam DMO, can have a triple layered structure in which the corresponding elements are formed to be perpendicular to the substrate SUB. For example, the dam structure can include a first layer formed of a planarization layer PLN, a second layer formed of a bank pattern BN, and a third layer formed of a spacer SP.

The first layer can have a pattern trapezoidal section structure of the planarization layer PLN. The second layer can have a trapezoidal section structure deposited on the first layer. The third layer can have a trapezoidal section structure deposited on the second layer. If the organic encapsulation layer PCL is thin to easily control spreading of the organic encapsulation layer PCL, the dam structure may not be required to be high. In this case, the third layer can be omitted.

The dam structure is fully covered by the first inorganic encapsulation layer PAS1 and/or the second inorganic encapsulation layer PAS2. The organic encapsulation layer PCL can be in contact with a portion of an inner wall of the dam structure. For example, a height from an edge area of the organic encapsulation layer PCL to an upper surface can be higher than the first layer of the dam structure DM and lower than the second layer of the dam structure DM. Alternatively, the height from the edge area of the organic encapsulation layer PCL to the upper surface can be higher than the second layer of the dam structure DM and lower than the third layer of the dam structure DM.

Preferably, the height from the edge area of the organic encapsulation layer PCL to the upper surface can be lower than the entire height of the dam structure. As a result, the first inorganic encapsulation layer PAS1 and the second inorganic encapsulation layer PAS2 are in surface-contact with each other on the upper surface and the outer sidewall of the dam structure.

A structure of the inner dam DMI according to the embodiment of the present disclosure will be described in more detail with reference to FIGS. 2 and 3 again. The inner dam DMI according to one embodiment of the present disclosure is arranged between the through-hole TH and the adjacent pixels Pc surrounding the through-hole TH inside the display area AA. Therefore, unlike the outer dam DMO, some elements of the light emitting diode ED can be deposited on the inner dam DMI. For example, the light emitting layer EL and the common electrode CE can be deposited to overstride the inner dam DMI.

The inner dam DMI can have a forward tapered shape. If the inner dam DMI has a forward tapered shape, although the organic encapsulation layer PCL can be prevented from being lost near the through-hole TH, the light emitting layer EL can be exposed from the sidewall of the through-hole TH and therefore can be vulnerable to water permeation. To avoid this, the inner dam DMI can have an inverse tapered shape. If the inner dam DMI has an inverse tapered shape, the light emitting layer EL can have a disconnection structure at a lower end of the inner dam DMI. In this case, water permeated through the portion exposed by the through-hole TH of the light emitting layer EL can be prevented from being diffused to the adjacent pixels Pc arranged near the through-hole TH.

In order to make sure of a display area ratio of the display area AA to the maximum range, it is preferable that the inner dam DMI is arranged to be very close to the through-hole TH. Therefore, water permeation cannot be shielded completely by the inner dam DMI of the inverse tapered shape. In the present disclosure, a hole-trench HTR is further provided to completely shield water permeated through the light emitting layer EL exposed at the side of the through-hole TH from being diffused to the adjacent pixels Pc regardless of the forward tapered shape or the inverse tapered shape of the inner dam DMI.

The hole-trench HTR has a closed curve shape corresponding to the shape of the through-hole TH. For example, if the through-hole TH has a circular shape, the hole-trench HTR can have a circular shape. Alternatively, the hole-trench HTR can have an oval shape surrounding the through-hole TH regardless of the shape of the through-hole TH. For another example, if the through-hole TH has a polygonal shape such as a rectangular shape, a hexagonal shape or an octagonal shape, the hole-trench HTR can have any one of a polygonal shape, a circular shape and an oval shape, which surround the through-hole TH. Hereinafter, for convenience, a description will be given based on that the through-hole TH has a circular shape and the hole-trench HTR has a circular shape surrounding the through-hole TH while having a concentric circle with the through-hole TH.

Preferably, the hole-trench HTR is arranged between the inner dam DMI and the adjacent pixels Pc. The section of the hole-trench HTR can have a well shape from which the substrate SUB is partially removed as much as a certain thickness. In more detail, the hole-trench HTR can be formed by etching the pixel array layer 120 and the substrate SUB together after the pixel array layer 120 is formed on the substrate SUB, the anode electrode AE is formed, and the bank BN for defining the light emitting area is patterned.

The hole-trench HTR includes a bottom surface BS, an upper surface US, and a sidewall SW connecting the bottom surface BS with the upper surface US. The bottom surface BS can be defined as the lowest surface of a recessed portion formed in the substrate SUB. The upper surface US can be defined as the uppermost surface of the substrate SUB in a state that the hole-trench HTR is formed. For example, since the hole-trench HTR is formed in the planarization layer PLN exposed after the bank BN is patterned, the upper surface of the planarization layer PLN can be defined as the upper surface US. The sidewall SW can be defined as a side of the hole-trench HTR connecting the bottom surface BS with the upper surface US.

After the hole-trench HTR is formed, the light emitting layer EL is deposited. The light emitting layer EL is deposited on the bottom surface BS of the hole-trench HTR and in the periphery of the upper surface US of the hole-trench HTR. However, since the light emitting layer is not deposited on the sidewall SW of the hole-trench HTR, the light emitting layer EL has a disconnection structure by the hole-trench HTR. Therefore, even though water is permeated into the light emitting layer EL exposed to the side of the through-hole TH, water can completely be shielded from being diffused to the adjacent pixels Pc arranged near the through-hole TH by the hole-trench HTR.

Since the hole-trench HTR is formed to allow the light emitting layer EL to be disconnected by the hole-trench HTR, it is preferable that the hole-trench HTR has a sufficient depth. Considering a process error, it is preferable that hole-trench HTR fully surrounds the through-hole TH and has a well shape from which the substrate SUB is removed at a predetermined thickness. As the case can be, even though a depth of the hole-trench HTR is shallow, the hole-trench HTR can disconnect the light emitting layer EL but preferably has a depth greater than the thickness of the substrate SUB as much as 20% or more to have a sure disconnection structure.

Further, the common electrode CE is deposited on the light emitting layer EL. The encapsulation layer 130 is deposited on the common electrode CE. Particularly, the first inorganic encapsulation layer PAS1 of the encapsulation layer 130 is first deposited. The first inorganic encapsulation layer PAS1 can be deposited along the upper surface US, the bottom surface BS and the sidewall SW of the hole-trench HTR. Therefore, water permeated through the light emitting layer EL exposed to the sidewall SW of the through-hole TH is completely shielded by hole-trench HTR and the first inorganic film PAS1 that covers the hole-trench HTR.

If the depth of the hole-trench HTR is too deep, the substrate SUB can be damaged by the hole-trench HTR. In this case, a function of the hole-trench HTR for preventing water permeation can remarkably be deteriorated. To prevent the function of the hole-trench HTR from being deteriorated, the depth of the hole-trench HTR should satisfy a condition that can maintain rigidity of the portion where the hole-trench HTR is formed in the substrate SUB. For example, it is preferable that a maximum depth of the hole-trench HTR does not exceed 70% of the thickness of the substrate SUB.

Hereinafter, the hole-trench surrounding the through-hole according to various embodiments of the present disclosure will be described with reference to FIGS. 5 and 6.

Figure 5:
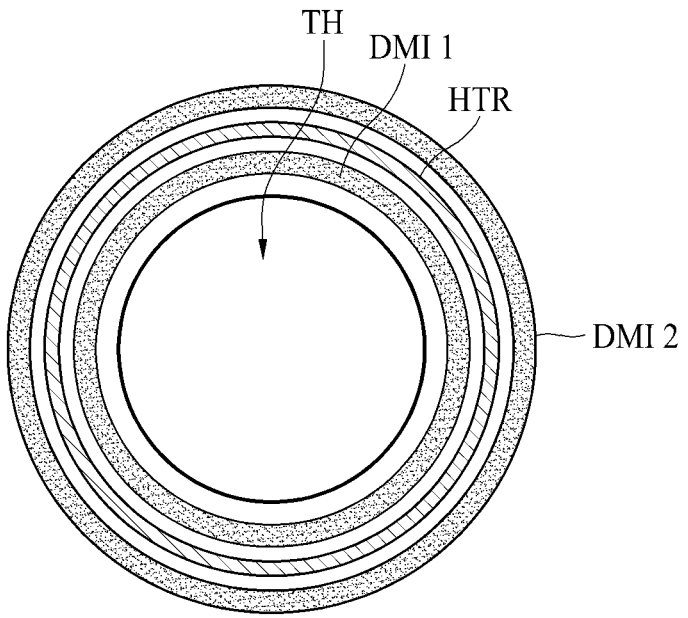
FIG. 5 is a plane view illustrating a structure of a through-hole and a hole-trench arranged in a display area of an electroluminescence display device according to one embodiment of the present disclosure.
Figure 6:
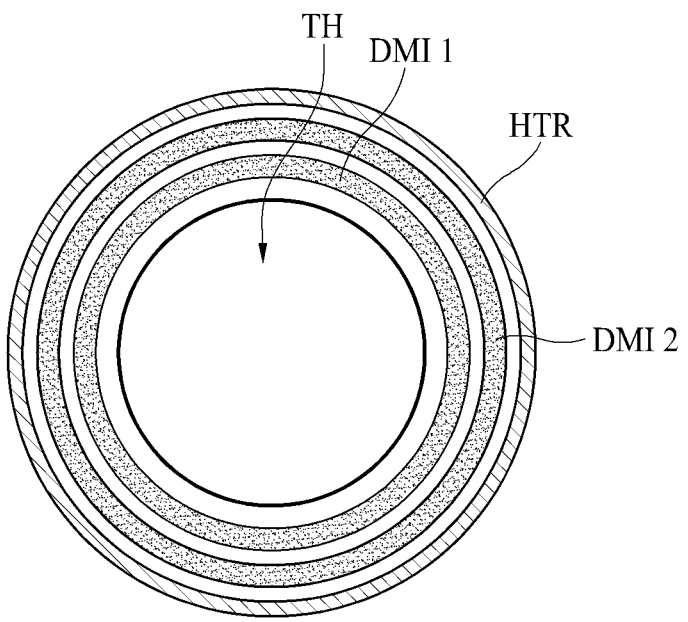
FIG. 6 is a plane view illustrating a structure of a through-hole and a hole-trench arranged in a display area of an electroluminescence display device according to another embodiment of the present disclosure.

FIG. 5 is a plane view illustrating a structure of a through-hole and a hole-trench arranged in a display area of an electroluminescence display device according to one embodiment of the present disclosure, and FIG. 6 is a plane view illustrating a structure of a through-hole and a hole-trench arranged in a display area of an electroluminescence display device according to another embodiment of the present disclosure. For convenience, the through-hole TH, the hole-trench HTR and the inner dam DMI are only shown in FIGS. 5 and 6. Although not marked in FIGS. 5 and 6, reference numerals mentioned in the following description are the same as those shown in FIGS. 1 to 3.

Referring to FIG. 5, the electroluminescence display device according to one embodiment of the present disclosure comprises a through-hole TH inside a display area. A first inner dam DMI1 surrounds the periphery of the through-hole TH. A second inner dam DMI2 surrounds the periphery of the first inner dam DMI1. A hole-trench HTR is arranged between the first inner dam DMI1 and the second inner dam DMI2. Pixels P including adjacent pixels Pc are arranged near the second inner dam DMI2.

In one embodiment according to FIG. 5, a plurality of inner dams including the first inner dam DMI1 and the second inner dam DMI2 are arranged to enhance their functions. Also, the hole-trench HTR is arranged between the first inner dam DMI1 and the second inner dam DMI2. At this time, it is preferable that a width of the hole-trench HTR is narrower than a width of the first inner dam DMI1 and a width of the second inner dam DMI2. Meanwhile, the first inner dam DMI1 and the second inner dam DMI2 can have the same width or their respective widths different from each other.

Preferably, a hole-boundary portion THB defined as an area between the through-hole TH and the adjacent pixel Pc has a narrow area if possible. If the hole-boundary portion THB is too wide, it can interrupt a display function. The first inner dam DMI1, the second inner dam DMI2 and the hole-trench HTR are arranged in the hole-boundary portion THB. In this case, the first inner dam DMI1 and the second inner dam DMI2 are intended to prevent an organic encapsulation layer PCL from overflowing to the outside, and have limitations in setting their narrow width values. On the other hand, the hole-trench HTR is intended to disconnect the light emitting layer EL, and disconnection of the light emitting layer EL is mainly related to the depth of the hole-trench HTR. Therefore, in order to make sure of a narrow width of the hole-boundary portion THB if possible, it is preferable that the width of the hole-trench HTR is not greater than the width of the first inner dam DMI1 and/or the second inner dam DMI2.

Referring to FIG. 6, the electroluminescence display device according to another embodiment of the present disclosure comprises a through-hole TH inside a display area. A first inner dam DMI1 surrounds the periphery of the through-hole TH. A second inner dam DMI2 surrounds the periphery of the first inner dam DMI1. A hole-trench HTR is arranged near the second inner dam DMI2. Pixels P including adjacent pixels Pc are arranged near the hole-trench HTR.

According to FIG. 6, a plurality of inner dams including the first inner dam DMI1 and the second inner dam DMI2 are arranged to enhance their functions. Also, the hole-trench HTR is arranged as surrounding the second inner dam DMI2. At this time, it is preferable that a width of the hole-trench HTR is narrower than a width of the first inner dam DMI1 and a width of the second inner dam DMI2. The first inner dam DMI1 and the second inner dam DMI2 can have the same width or their respective widths different from each other.

The electroluminescence display device according to one embodiment of the present disclosure can be applied to various products such as a television, a notebook computer, a monitor, a refrigerator, a microwave oven, a washing machine and a camera as well as portable electronic devices such as an electronic diary, an electronic book, a PMP (Portable Multimedia Player), a navigator, a UMPC (Ultra Mobile PC), a smart phone, a mobile communication terminal, a mobile phone, a tablet PC (personal computer), a smart watch, a watch phone and a wearable device.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display device comprising:
   a substrate having a display area and a non-display area adjacent with the display area, the display area having a plurality of pixels for displaying images;
   a thin film transistor on the substrate;
   a light emitting diode electrically connected with the thin film transistor, and including a pixel driving electrode, a light emitting layer and a common electrode;
   an encapsulation layer disposed on the light emitting diode, the encapsulation layer including a first inorganic layer, a second inorganic layer on the first inorganic layer, and an organic layer between the first inorganic layer and the second inorganic layer;
   a through-hole disposed in the display area, the through-hole penetrating the substrate and the encapsulation layer;
   a first inner dam surrounding the through-hole; and
   a hole-trench disposed between the first inner dam and a group of adjacent pixels arranged closest to the inner first dam among the plurality of pixels,
   wherein the hole-trench includes:
      a bottom surface defined as a lowest surface of a recessed portion formed in the substrate;
      an upper surface defined as an uppermost surface of a layer disposed below a bottom surface of the first inner dam; and
      a sidewall defined as a side surface connecting the bottom surface of the hole-trench with the upper surface of the hole-trench, and
   wherein the light emitting layer is directly contacting the bottom surface of the hole-trench, is disposed on the upper surface of the hole-trench, and is disconnected at the sidewall of the hole-trench.

2. The electroluminescence display device of claim 1, wherein the first inorganic layer covers the bottom surface of the hole-trench and the sidewall of the hole-trench.

3. The electroluminescence display device of claim 2, wherein the organic layer is disposed in the hole-trench to fill-in an inner portion of the hole-trench, and contacts the first inorganic layer that covers the bottom surface of the hole-trench.

4. The electroluminescence display device of claim 3, wherein the second inorganic layer is disposed on the organic layer, and covers the first inner dam.

5. The electroluminescence display device of claim 4, wherein the second inorganic layer is contact with the first inorganic layer on an upper surface and an outer sidewall of the first inner dam.

6. The electroluminescence display device of claim 3, wherein the organic layer is in contact with a portion of an inner wall of the first inner dam.

7. The electroluminescence display device of claim 1, wherein the first inner dam is disposed between the hole-trench and the through-hole.

8. The electroluminescence display device of claim 1, wherein the hole-trench has a width narrower than a width of the first inner dam.

9. The electroluminescence display device of claim 1, wherein the common electrode is disposed on the bottom surface of the hole-trench and the upper surface of the hole-trench, and is disconnected at the sidewall of the hole-trench.

10. The electroluminescence display device of claim 1, wherein the common electrode and the light emitting layer are disposed between the bottom surface of the hole-trench and the first inorganic layer.

11. The electroluminescence display device of claim 1, further comprising a second inner dam surrounding the hole-trench.

12. The electroluminescence display device of claim 1, further comprising a second inner dam between the first inner dam and the hole-trench.

13. The electroluminescence display device of claim 1, wherein an uppermost surface of the first inner dam is disposed equal to or higher than that of the pixel driving electrode.

14. The electroluminescence display device of claim 1, wherein the light emitting layer disposed on the bottom surface of the hole-trench contacts the substrate.

15. An electroluminescence display device comprising:
   a substrate having a display area and a non-display area;
   a plurality of pixels for displaying images, and located in the display area, the each pixel comprising a light emitting diode including a pixel driving electrode, a light emitting layer and a common electrode;
an encapsulation layer on the light emitting diode;
a through-hole in the display area; and
a hole-trench disposed between the plurality of pixels and the through-hole,
wherein the hole-trench includes:
   a bottom surface defined as a lowest surface of the hole-trench formed in the substrate;
   an upper surface defined as an uppermost surface of a layer having an entrance of the hole-trench; and
   a sidewall defined as a side surface connecting the bottom surface of the hole-trench with the upper surface of the hole-trench, and
wherein the light emitting layer is directly contacting the bottom surface of the hole-trench, is disposed on the upper surface of the hole-trench, and is disconnected at the sidewall of the hole-trench.

16. The electroluminescence display device of claim 15, wherein the sidewall of the hole-trench is entirely perpendicular to at least one of the bottom surface and the upper surface of the hole-trench.

17. The electroluminescence display device of claim 16, wherein a width of the hole-trench is constant in a depth direction of the hole-trench.

18. The electroluminescence display device of claim 15, further comprising a first inner dam between the through-hole and the hole-trench,
wherein the common electrode is on an upper surface and a sidewall of the first inner dam, and is disconnected at the entrance of the hole-trench.

19. The electroluminescence display device of claim 15, wherein the common electrode is disconnected at the hole-trench, and a disconnected end of the common electrode is tapered at the entrance of the hole-trench.

20. The electroluminescence display device of claim 15, wherein the common electrode on the bottom surface of the hole-trench completely covers the bottom surface of the hole-trench.

21. The electroluminescence display device of claim 15, wherein the encapsulation layer includes an inorganic layer and an organic layer on the inorganic layer, and
wherein the inorganic layer covering the sidewall of the hole-trench is entirely parallel with the sidewall of the hole-trench.

22. The electroluminescence display device of claim 21, wherein only the light emitting layer, the common electrode, the inorganic layer and the organic layer is within the hole-trench.

23. The electroluminescence display device of claim 15, wherein the hole-trench is in the display area.

24. The electroluminescence display device of claim 15, wherein the common electrode is disposed on the light emitting layer at the bottom surface of the hole-trench and at the upper surface of the hole-trench, and the common electrode is disconnected at the sidewall of the hole-trench.

25. The electroluminescence display device of claim 18, further comprising a second inner dam surrounding the hole-trench.

26. The electroluminescence display device of claim 18, further comprising a second inner dam between the first inner dam and the hole-trench.

* * * * *